(12) United States Patent
Huber

(10) Patent No.: US 10,700,445 B2
(45) Date of Patent: Jun. 30, 2020

(54) ELECTRICAL FUNCTIONAL COMPONENT HAVING A CONTACT PIN AND METHOD FOR PRODUCING AN ELECTRICAL FUNCTIONAL COMPONENT

(71) Applicant: Raimund Huber, Lechaschau (AT)

(72) Inventor: Raimund Huber, Lechaschau (AT)

( * ) Notice: Subject to any disclaimer, the term of this patent is extended or adjusted under 35 U.S.C. 154(b) by 0 days.

(21) Appl. No.: 15/541,198

(22) PCT Filed: Dec. 10, 2015

(86) PCT No.: PCT/EP2015/079246
§ 371 (c)(1),
(2) Date: Jun. 30, 2017

(87) PCT Pub. No.: WO2016/110369
PCT Pub. Date: Jul. 14, 2016

(65) Prior Publication Data
US 2017/0365936 A1 Dec. 21, 2017

(30) Foreign Application Priority Data
Jan. 8, 2015 (DE) .......................... 10 2015 100 149

(51) Int. Cl.
H01R 4/10 (2006.01)
B23K 20/02 (2006.01)
(Continued)

(52) U.S. Cl.
CPC ............... *H01R 4/10* (2013.01); *B23K 20/02* (2013.01); *B23K 20/22* (2013.01); *H01B 5/02* (2013.01);
(Continued)

(58) Field of Classification Search
CPC ...... H01R 4/10; H01R 13/03; H01R 12/7064; H01R 13/04; H01R 43/0207; H01R 43/16;
(Continued)

(56) References Cited

U.S. PATENT DOCUMENTS 3,252,204 A * 5/1966 McFaddan ............... H01R 9/16
228/116
3,718,750 A * 2/1973 Sayers ................. H01R 12/523
174/94 R (Continued)

FOREIGN PATENT DOCUMENTS

CN 102192812 A 9/2011
DE 692 08 507 T2 2/1996
(Continued)

OTHER PUBLICATIONS

International Search Report and Written Opinion dated Mar. 24, 2016 in connection with PCT/EP2015/079246.
(Continued)

*Primary Examiner* — Travis S Chambers
(74) *Attorney, Agent, or Firm* — Quarles & Brady LLP

(57) ABSTRACT

The invention relates to an electrical functional component having at least one electrically conductive conductor strip, at least one contact pin being arranged on the conductor strip, said contact pin being able to be contacted with a complementary contact element, and a contact zone being provided between the conductor strip and the contact pin, said contact zone electrically connecting the conductor strip and the contact pin to each other, the electrically conductive contact zone being formed in an annular cold-pressure-welded transition zone, the surface material of the conductor strip-and/or the surface material of the contact pin comprising at least one cold-working area in the transition zone, a welding zone being provided at least in sections on or in at least one (Continued)

cold-working zone, the contact pin and the conductor strip being connected to each other in the welding zone in an electrically conductive manner by material bonding.

16 Claims, 9 Drawing Sheets

(51) Int. Cl.
| | |
|---|---|
| *H01R 12/58* | (2011.01) |
| *H01R 13/04* | (2006.01) |
| *H01R 43/02* | (2006.01) |
| *H01R 43/16* | (2006.01) |
| *B23K 20/22* | (2006.01) |
| *H01B 5/02* | (2006.01) |
| *H01B 13/00* | (2006.01) |
| *H01R 12/70* | (2011.01) |
| *H01R 13/03* | (2006.01) |
| *H05K 1/02* | (2006.01) |
| *B23K 101/38* | (2006.01) |
| *H01R 4/60* | (2006.01) |
| *B23K 101/34* | (2006.01) |

(52) U.S. Cl.
CPC ....... *H01B 13/0036* (2013.01); *H01R 12/585* (2013.01); *H01R 12/7064* (2013.01); *H01R 13/03* (2013.01); *H01R 13/04* (2013.01); *H01R 43/0207* (2013.01); *H01R 43/16* (2013.01); *H05K 1/02* (2013.01); *B23K 2101/34* (2018.08); *B23K 2101/38* (2018.08); *H01R 4/60* (2013.01)

(58) Field of Classification Search
CPC .......... H01R 12/585; H01R 4/60; H05K 1/02; H01B 5/02; H01B 13/0036; B23K 20/22; B23K 20/02; B23K 2201/38; B23K 2201/34
USPC .......................................................... 439/84
See application file for complete search history.

(56) References Cited

U.S. PATENT DOCUMENTS

| | | | | | |
|---|---|---|---|---|---|
| 3,805,214 | A * | 4/1974 | Demler, Sr. | .......... | H01R 43/015 439/83 |
| 6,099,078 | A * | 8/2000 | Smithson | ................ | B60R 22/28 280/805 |
| 6,293,134 | B1 * | 9/2001 | Johnson | ............... | B21D 19/088 72/335 |
| 2013/0078053 | A1 * | 3/2013 | Wiley | ..................... | F16B 7/187 411/163 |
| 2013/0130572 | A1 * | 5/2013 | Sakae | ................... | H01M 2/206 439/884 |
| 2013/0167373 | A1 * | 7/2013 | Hwang | ................... | H01L 24/11 29/879 |
| 2014/0212740 | A1 * | 7/2014 | Munenaga | .............. | H01M 2/22 429/178 |
| 2015/0000976 | A1 * | 1/2015 | Frohler | .................... | H01R 4/02 174/74 R |

FOREIGN PATENT DOCUMENTS

| | | | |
|---|---|---|---|
| DE | 20 2009 017 984 U1 | 11/2010 | |
| DE | 10 2013 111 963 A1 | 5/2015 | |
| DE | 10 2014 208 101 A1 | 10/2015 | |
| EP | 0 510 978 B1 | 2/1996 | |
| EP | 1282191 A2 * | 2/2003 | ............. H01R 11/12 |
| EP | 1 720 387 A1 | 11/2006 | |
| EP | 2 581 966 A1 | 4/2013 | |
| EP | 2 579 393 A1 | 10/2013 | |
| WO | 2010 093971 A1 | 8/2010 | |
| WO | 2014 076122 A1 | 3/2014 | |
| WO | 2015 165946 A1 | 11/2015 | |

OTHER PUBLICATIONS

PCT English Language Translation of the International Preliminary Report on Patentability, PCT/EP2015/079246, dated Jul. 20, 2017.
China National Intellectual Property Administration, First Office Action and Search Report, Application No. 201580072348.4, dated Oct. 8, 2018, 21 pages.
China National Intellectual Property Administration, Second Office Action, Application No. 201580072348.4, dated May 15, 2019, 14 pages.
China National Intellectual Property Administration, Third Office Action and Search Report, Application No. 201580072348.4, dated Jan. 13, 2020, 19 pages.

* cited by examiner

ELECTRICAL FUNCTIONAL COMPONENT HAVING A CONTACT PIN AND METHOD FOR PRODUCING AN ELECTRICAL FUNCTIONAL COMPONENT

CROSS-REFERENCE TO RELATED APPLICATIONS

This application represents the national stage entry of PCT International Application No. PCT/EP2015/079246 filed on Dec. 10, 2015, which claims the benefit of German Patent Application No. 10 2015 100 149.7 filed on Jan. 8, 2015, he entire contents of which are incorporated herein by reference for all purposes.

The invention relates to an electrical functional component having at least one conductor strip, to which a contact pin is mounted in an electrically conductive manner, according to the preamble of claim 1. Furthermore, the invention relates to a method for producing an electrical functional component.

Generic electrical functional components are characterized in that at least one electrically conductive conductor strip is provided on the functional component. At least one contact pin is arranged at the conductor strip. The task of the contact pin is to contact the conductor strip of the functional component with a contact element formed complementary in function in a preferably detachable manner. The contact element formed complementary in function can be a plug element in a plug or a socket, for example. In these cases, the electrical functional component itself is formed in the type of a plug or an illuminant, for example. Generic electrical functional components formed in the type of printed circuit boards are also known. In these printed circuit boards, the contact pins serve for contacting the printed circuit board, such as on plugs or power strips.

In order to ensure the electrical function of the functional component, it is generally necessary to provide a contact zone between the conductor strip and the contact pin, said contact zone connecting the conductor strip and the contact pin in an electrically conductive manner. Due to the different functions of the contact pin and the conductor strip, it is therefore necessary, in other words, to produce these two components separately and to then connect them in a joining process in an electrically conductive and mechanically durable manner. Since each contact point generates an additional electrical resistance, which is caused mostly by constricting the current-carrying surfaces in the micro-contacts, a very good electrical contact is absolutely required between the contact pins and the conductor strips in order to prevent power loss. What is more, the contact zone between the conductor strip and the contact pin constitutes a possible fault source for the function of the functional component if the contact quality of the contact zone falls below a certain degree.

Other than the contact type, the real metallic contact surface is of significant importance regarding the quality of the contact. In this context, a distinction must be made between the surface overlap, i.e. the apparent contact surface between the conductor strip and the contact pin on the one hand, and the real metallic contact surface actually carrying current, since the real contact surface actually carrying current is considerably smaller even though the geometric conditions are the same. This is due to the fact that even apparently level metal surfaces do not entirely touch each other due to their surface topography or their roughness, respectively, but contact each other in comparatively small areas. The more the two contact surfaces are pressed against each other, the more the actual current-carrying contact surface approaches the degree of the apparent contact surface, which is attained by corresponding deformations of the surface tips.

In particular in the field of electrical power technology, it is also known that contact surfaces age over time and thus the electrical resistance also increases over time. The contact zones can even be entirely destroyed in consequence of the age-related increase in resistance. This mechanism is influenced by different ageing mechanisms (chemical reactions, electrical migration, interdiffusion, fretting and force reduction) occurring simultaneously in the contact zones. Depending on the load current and the surrounding conditions, one or more of these mechanisms can accelerate the ageing process of the contact zone. In particular in thermally highly stressed electrical contacts, the force reduction and the chemical reactions can crucially accelerate the ageing process via oxidation and relaxation due to high operating temperatures. The contact pressure between the contact surfaces can vastly decline within weeks due to dynamic recovery, creeping or changes of the mechanical properties of the conductor material. Thus, the contact resistance can vastly increase when there are small adhesive forces in relation to the initial values after the connection has been installed and hence the contact resistance can cause functional errors despite the components having been tested.

In order to produce the contact zone between the conductor strip and the contact pin, different joining techniques are known from the state of the art, said joining techniques simultaneously providing sufficient electrical contact between the conductor strip and the contact pin and mechanically fixing the contact pin to the conductor strip. The most commonly used joining techniques for producing a contact zone between the conductor strip and the contact pin are screwing, welding and riveting. A solder connection is less commonly used.

In a screw connection, the electrical circuit is closed only secondarily and to a comparatively small degree via the screwable connecting element used. In contrast, the electrical circuit is closed primarily via the contact surfaces produced by the screw connection, the material of the conductor strip and the material of the contact pin being pressed against each other in the contact surfaces by pressing the screw element. In particular the roughness of the component surfaces and the oxidation layers existing on the contact surfaces play a role in the quality of the contact in that context. The quality of the contact of such screw connections on generic electrical functional components is therefore relatively low and has a high dispersion. Apart from this, a disadvantage of such screw connections is that relatively many individual parts have to be provided, requiring a cumbersome installation. In cyclic mechanical loads, a subsequent maintenance interval is additionally required in order to reliably maintain the required pressure between the contact surfaces.

When using welding methods for contacting the conductor strip with the contact pin, a very low connecting resistance is attained due to the material bonding. However, the application scope of such welding methods for joining the contact pin to the conductor strip is fairly small since coated and thermally sensitive components cannot be welded or can only be welded with great difficulty. In particular when joining thermally sensitive components, such as electronic components, or when using component assemblies having pre-assembled plastic parts, the heat input caused by welding is of a significant disadvantage. Surface coatings can also be negatively influenced via welding. Furthermore, the component design and the component geometry resulting therefrom can also prevent the use of welding as a joining technique. Delicate components, such as very fine conductor strips, are moreover distorted by the heat input caused by welding, said thermal distortion not being able to be remedied by subsequently adjusting the components.

When using riveting techniques for contacting the contact pin with the conductor strip, contact pins can be used, for example, at whose shaft a contact rivet is formed. For this purpose, this contact rivet comprises a collar for giving support in the edge area of a recess in the conductor strip. What is more, the contact rivet is provided with a rivet head, which is tilted in the conductor strip on the opposite side of the recess and thus realizes a force fit between the contact pin and the conductor strip. This contact connection causes an axially directed pressing force between the frontal face of the collar and the inner frontal face of the rivet head on the one hand and the surface areas of the conductor strip on the opposite side on the other hand. In contrast, a pressing force radially acting on the cylinder-shaped perimeter surface of the contact rivet is not available or is available only to a very small degree. Since no radially acting contact forces can be generated to a significant degree, the quality of the contact in such rivet connections is very low. What is more, producing such contact rivets at the contact pin is cumbersome since the contact shaft, the collar and the rivet-head shaft can only be produced via machining production methods, in particular by turning parts. A significant disadvantage of rivet connections is that they are highly sensitive to temperatures since rivet connections start to loosen at an environmental temperature of approximately 150° C. and above due to material relaxation and the force reduction related thereto and the electrical quality of the contact significantly decreases. A crevice corrosion is also facilitated by the loosening of the rivet connection, which can in turn lead to the electrical functional component failing.

In order to produce the electrical contact between the contact pin and the conductor strip, said components can be soldered together. Such soldering methods, however, have the disadvantage of requiring a comparatively cumbersome handling. Moreover, the supply of the soldering material frequently leads to chemical reactions between the contact partners, which cause the contact point to age.

Based on this state of the art, it is the object of the invention at hand to propose a new electrical functional component having a contact zone between a conductor strip and a contact pin, by means of which electrical functional component the disadvantages described above of the generic functional components are circumvented. What is more, it is the object of the invention at hand to propose a new method for producing such functional components.

These objects are attained by a functional component and a method, respectively, according to the teachings of the two independent claims. Advantageous embodiments of the invention are the subject matter of the dependent claims.

The functional component according to the invention is characterized in that the electrically conductive contact zone between the conductor strip and the contact pin is formed in the type of an annular and cold-pressure-welded transition zone. By using a suitable production method, in particular the method according to the invention to be described hereinafter, the surface material of the conductor strip and/or the surface material of the contact pin is/are cold-formed in the transition zone when joining the contact pin to the conductor strip so that a cold-working area is formed in the transition zone in the edge layers of the material of the conductor strip or of the material of the contact pin, respectively. The joining pressure is to be chosen so high that at least one cold-pressure-welded welding zone is formed on or in at least one cold-working zone, the contact pin and the conductor strip being connected in said welding zone by material bonding in an electrically conductive manner. Since the contact zone is annular in shape according to the invention, forming the cold-working area and the welding zone can be accomplished in a simple manner by the outer perimeter of the contact pin and the inner perimeter of the recess or indentation, respectively, comprising a material overlap. When pressing the contact pin into the recess or indentation, respectively, this overlap ensures that the two components are pressed against each other in their superficial material layers using massive pressure and are moved past each other. The deformations occurring in the crystal lattice of the participating joining partners ensure that a material bonding is present at least in sections.

The existence of cold-working zones at each of the two joining partners and the dimensions of these two cold-working zones in relation to each other depend in particular on the cold-working resistance of the corresponding materials or the surface coatings, respectively. In order to achieve a high contact quality, both joining partners should comprise a cold-working zone in their superficial material layers, these cold-working zones surrounding the welding zone arranged therebetween in layers.

The required degree of material overlap between the two joining partners can be determined by simple experiments while producing microsections of the contact zone. The material overlap can only be so large that a macroscopic deformation of the two joining partners via the joining process is precluded. Vice versa, the material overlap must be so large that a cold-welded welding zone having a material bonding between the two joining partners is formed by pressing the contact pin into the recess or indentation, respectively. This can be easily controlled by testing the pressing force in the running production process or in the production of microsections and by testing the extraction force in the form of random sampling.

Compared to the known state of the art, the functional component according to the invention has the advantage that a connection having a high mechanical load capacity between the two joining partners on the one hand and an electric contact zone having a high electrically conductive quality on the other hand can be produced in one step. A macroscopic heat input in the material does not occur in this process so that undesired distortion effects are precluded. What is more, joining partners having nearly any desired material properties can be simultaneously joined to each other in a mechanical and electrically conductive manner. The cold-welded contact zone is not subject to any crevice corrosion and a drop in the performance quality in the contact zone even over a longer period of time is virtually precluded.

The constructive manner in which the conductor strip is realized is generally arbitrary as long as the conductor strip comprises sufficient mechanical stability in order to press the contact pin into the recess or the indentation, respectively. The conductor strip can, for example, be a solid metallic component, as commonly known in the production of plug contacts for illuminants, for example. In regard of avoiding a high thermal input and the undesired distortion effects caused thereby, the invention has significant advantages if the conductor strip is realized in the type of a conductive sheet, in particular in the type of a punched grid. Highly delicate conductor strips can be provided at such conductive sheets, said conductor strips being able to be produced in a cost-efficient manner in particular via punching. By using suitable pressing tools having a plurality of receptacles for the contact pins, it is possible to simultaneously equip such a conductive sheet with a plurality of contact pins in a simple and cost-efficient manner. The cold formation resulting in the formation of the cold-welding zone thus moreover leads to the contact pins being connected to the conductive sheet in a mechanically high-strength manner, thus reaching high maximum extraction forces.

The mechanical strength of the connection between the contact pin and the conductor strip as well as the electrical conductive quality between the contact pin and the conductor strip have been significantly influenced by how large the annular and cold-pressure-welded transition zone is. In this context, the diameter of the transition zone is mostly pre-determined by the type of construction since the width of conductor strips in conductive sheets cannot be arbitrarily increased. What is more, the diameter of the plug contacts is also mostly predetermined. In particular when using especially thin conductor strips, it is advantageous if an annular protrusion on the conductor strip is provided in the area of the contact zone, said protrusion forming a material thickening in the conductor strip. If the recess or indentation, respectively, is arranged in the area of this protrusion, the height of the annular cold-pressure-welded transition zone can be enlarged by this arrangement. In particular, it is possible to realize a height of the construction zone which is greater than the thickness of the conductor strip itself.

In order to achieve a secure fit having a high conductive quality when pressing the contact pins into the recess of a conductor strip, without having to observe excessive tolerances regarding the diameter overlap, it is particularly advantageous if the contact pin entirely engages through the conductor strip in the recess and protrudes over the conductor strip at least partially with both ends. By the contact pin protruding over the conductor strip on both sides, it is possible to vary the insertion depth of the contact pin in order to compensate for tolerances, in particular to compensate for diameter tolerances, when pressing the contact pin in. In particular, such a tolerance compensation can be simplified by the contact pin tapering in the joining direction or the recess narrowing in the joining direction, respectively (cf. the description below). By the contact pin becoming wider or alternatively by the recess tapering, as the contact pin is pressed in more and more deeply, it is achieved that the material overlap becomes larger upon increasing the insertion depth.

The contacting according to the invention by pressing in a contact pin while forming a cold-pressure-welded transition zone is of particular advantage even when two conductor strips are to be plated through. A recess can be provided in each of the two conductor strips. These recesses are aligned flush atop of each other and the contact pin is passed through each recess while forming a cold-pressure-welded transition zone in each instance.

As has already been described above, the tolerance compensation, in particular in regard of the material overlap between the contact pin and the conductor strips, is simplified by the contact pin comprising a cross-sectional constriction on at least one end, in particular a chamfer or a radius on at least one end cross section or a cone-segment-shaped cross section. The contact pin can moreover be easily disposed and centered in the recess or the indentation, respectively, by the cross section of the contact pin narrowing in the direction in which the contact pin is pressed in. A high material overlap is achieved with the increasing insertion depth to such an extent that the effect of forming a cold-pressure-welded transition zone according to the invention is achieved by corresponding cold working.

The change in the cross section of the contact pin required for forming a desired cross-section reduction can of course be produced by any production method, such as a machining production of the contact pins. This type of production, however, is fairly costly since the contact pins are mass production components. It is therefore preferable if the contact pin comprises a tear surface on at least one frontal side and comprises a constriction across at least a short section behind the frontal side. Such contact pins can be produced in a very cost-efficient manner by employing tearing methods on continuous wires. For this purpose, the strongly heated wire, for example, can be pulled in the direction of its longitudinal stretch in the tearing device until the wire constricts itself at a defined distance and tears transversely to the constriction resulting in the formation of the frontal side of the contact pin. Such contact pins can be produced in a very cost-efficient manner and have a high dimensional accuracy in regard of the outer diameter.

Furthermore, it is particularly advantageous if the cross section of the contact pin is realized mirror-symmetrical regarding its middle. By the mirror-symmetrical design of the contact pin, it can be achieved that the contact pin can be pressed into the recess or indentation, respectively, with one end or the other end as desired. When supplying the contact pin to the joining device, it is of great advantage that the contact pin does not have to be positioned in a preferred direction while being supplied. Instead, simple bowl feeders can be used for supplying the contact pins, said bowl feeders positioning the contact pins in their longitudinal direction without having to consider a preferred direction of the contact pins.

In regard of the long-term stability of the cold-pressure-welded transition zone, it is particularly advantageous if the contact zone, in which the contact pin is pressed in, is arranged on one end of the conductor strip. On this end of the conductor strip, an annulus-segment-shaped contact area can be provided which engages around the annular cold-pressure-welded transition zone on all sides. When pressing the contact pin into this annulus-segment-shaped contact area, the material of the conductor strip is radially widened due to the material overlap and thus is not only plastically deformed in the contact zone but is elastically widened in general. The elastic restoring forces resulting therefrom lead to the annulus-segment-shaped contact section being elastically pressed inward and the cold-pressure-welded transition zone cohering without cracks even over long periods of time.

As has already been described, maintaining an exactly defined material protrusion between the outer perimeter of the contact pin and the inner perimeter of the recess or indentation, respectively, in order to form the cold-pressure-welded transition zone according to the invention is of significant importance. In order to be able to reliably maintain the material protrusion when producing a high number of pieces regarding process safety, it is therefore particularly advantageous if the contact pin comprises a calibrated outer perimeter at least in sections and/or the recess or indentation, respectively, comprises a calibrated inner perimeter at least in sections. By calibrating the perimeters, a high dimensional accuracy can be ensured which enables maintaining slight tolerances in the area of the material protrusion.

Insofar as the materials used for producing the contact pin or the conductor strip, respectively, allow forming a cold-pressure-welded transition zone only to a limited extent, the conductor strip and/or the contact pin can comprise a metallic coating. The resistance to deformation of the coating material is therefore to be chosen lesser than the resistance to deformation of the coated material arranged therebelow in order to thus simplify forming a cold-pressure-welded transition zone since materials having a lesser resistance to deformation, such as gold or silver, allow forming a cold-pressure-welded transition zone having a high joining quality.

The cross-sectional form of the contact pin or the cross-sectional form of the recess or rather indentation, respectively, as well as the cross-sectional form of the annular-shaped cold-pressure-welded transition zone resulting therefrom is generally arbitrary. In the simplest design, it is intended that circular contact pins are pressed into circular recesses or indentations, respectively, so that a cylinder-shaped transition zone is formed. Alternatively, the contact pin can have any prismatic shape, for example square or polygonal. The cross section of the recess or the indentation, respectively, should have a corresponding prismatic design. As a result, a cold-pressure-welded transition zone having a prismatic design can be produced.

It is generally of no consequence for which type of electrical functional component the annular cold-pressure-welded transition zone according to the invention is intended. Attaching the contact pins to conductor strips via a cold-working joining method used on printed circuit boards, plugs or illuminants is particularly advantageous.

For producing the functional component according to the invention, a method having the following method steps can be used:

a) First, a recess or an indentation, respectively, is produced in a conductor strip. This can be done by using a printed circuit board made of sheet metal by using a punching tool, with which the conductive sheet is punched.

b) Subsequently, one or more contact pins are supplied, the outer perimeter of the contact pin being larger at least in sections than the inner perimeter of the recess or the indentation, respectively. The one end of the contact pin is inserted into or disposed at, respectively, the recess or indentation.

c) When the contact pin and the recess or the indentation, respectively, are in the correct relative position, the contact pin is pressed into the recess or indentation, respectively, by using a suitable tool, such as an extrusion die comprising indentations, in which the contact pins are held. Due to the material overlap between the contact pin on the one hand and the recess of the conductor strip on the other hand, an annular cold-pressure-welded transition zone is formed when the contact pin is pressed in. This transition zone comprises a welding zone, in which the contact pin and the conductor strip are connected to each other in an electrically conductive manner.

For producing the recess in a conductive sheet, an extrusion die can be used, with which the conductive sheet is hole-punched.

For producing an annular protrusion in the area of the recess of a conductive sheet, a mandrel can be used, by means of which the material of the conductive sheet is pervaded. By this means, a height of the transition zone can be attained which is larger than the thickness of the conductive sheet used.

In order to calibrate the recess in the conductive sheet to a narrowly tolerated diameter, a calibrating mandrel or any other calibrating tool can be inserted into or pushed through the recess.

In order to plate through two conductor strips, the conductor strips are arranged above one another having recesses aligned flush atop of each other, and then a contact pin is simultaneously pressed through both recesses, engaging through the recesses at least partially.

If several contact pins are simultaneously plated through both conductor strips in this way, an attachment of the two conductor strips relative to one another can be realized in this manner.

The method becomes particularly cost-efficient if a continuous wire material is torn into wire sections which in particular have constrictions at their ends, in order to produce the contact pin.

Different embodiments of the invention are shown in the drawings in a partially schematic manner and are described by way of example.

In the figures.

Figure 1:
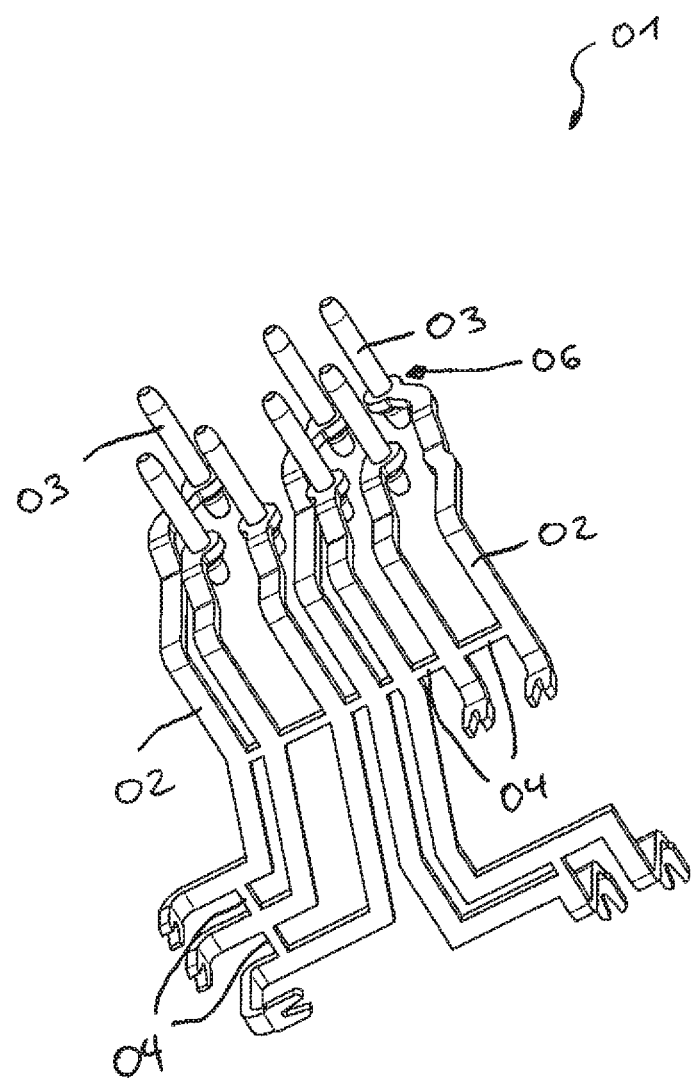
FIG. 1 shows an electrical functional component having several conductor strips and contact elements in a perspective view.

FIG. 1 shows an electrical functional component 01 comprising several conductor strips 02, at whose ends contact pins 03 are arranged in an electrically conductive manner. The contact pins 03 serve for attaching a plug, which is not shown in FIG. 1, to the functional component 01.

The conductor strips 02 are produced by punching a conductive sheet, although initially various connecting cross pieces 04 remain for installation purposes. The connecting cross pieces 04 are removed after the functional component 01 has been overmolded with plastic so that all conductor strips 02 are electrically isolated from each other.

An electrically conductive contact zone is provided between the conductor strips 02 and the contact pins 03, respectively, so that electric current can be transmitted between the conductor strips 02 and the contact pins 03 essentially without resistance. The electric contact zone between the conductor strips 02 and the contact pins 03 is realized by pressing the contact pins 03 into cylinder-shaped recesses at the end of the conductor strips 02, an annular cold-pressure-welded transition zone being formed between the conductor strips 02 and the contact pins 03 by pressing the contact pins 03 in. The method for producing the electrically conductive contact zone between the contact pins 03 and the conductor strips 02 will be further described hereinbelow with reference to the drawings FIG. 2 through FIG. 5.

Figure 2:
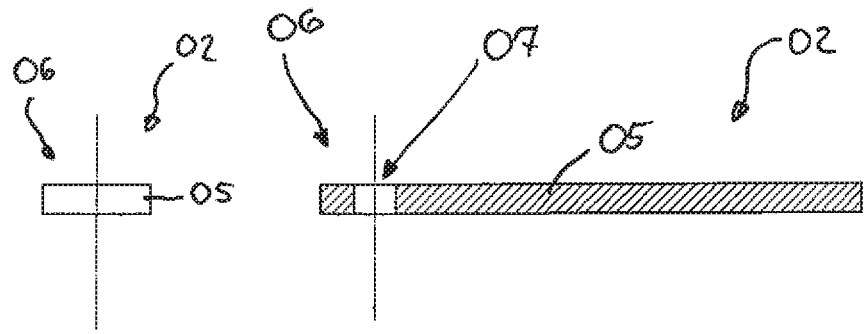
FIG. 2 shows a conductor strip of the functional component according to FIG. 1, before a protrusion has been formed, in a cross-sectional and lateral view.

In FIG. 2, the conductive sheet 05, from which the conductor strips 02 are punched, is first shown in a cross-sectional view. A recess 07 having a cylinder-shaped cross section is formed at the end 06 of the conductor strips 02 by means of a punching mandrel.

Figure 3:
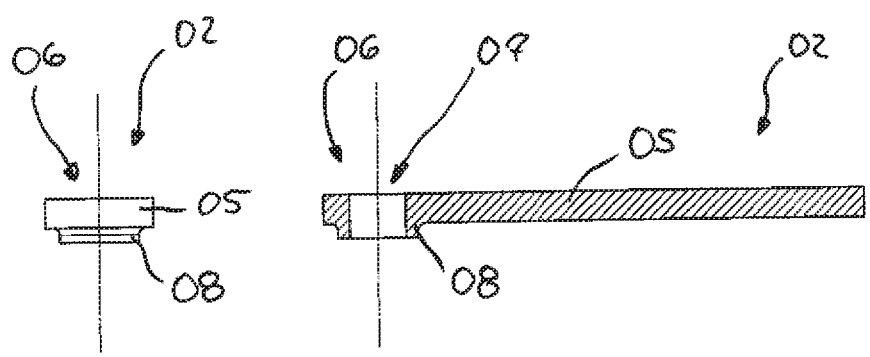
FIG. 3 shows the conductor strip according to FIG. 2, after a protrusion has been formed and before a contact pin has been attached, in a cross-sectional and lateral view.

FIG. 3 shows the conductor strip 02 after another production step. In this production step, the material of the conductive sheet 05 is pervaded in the area of the recess 07 by means of a mandrel and thus the conductive sheet 05 is cold-worked in the area of the recess 07, resulting in the formation of a protrusion 08. As can be seen in FIG. 3, the conductor strip 02 thus comprises a material thickening in the area of the recess 07, the thickness of the material thickening being larger than the thickness of the conductive sheet 05 used.

Figure 4:
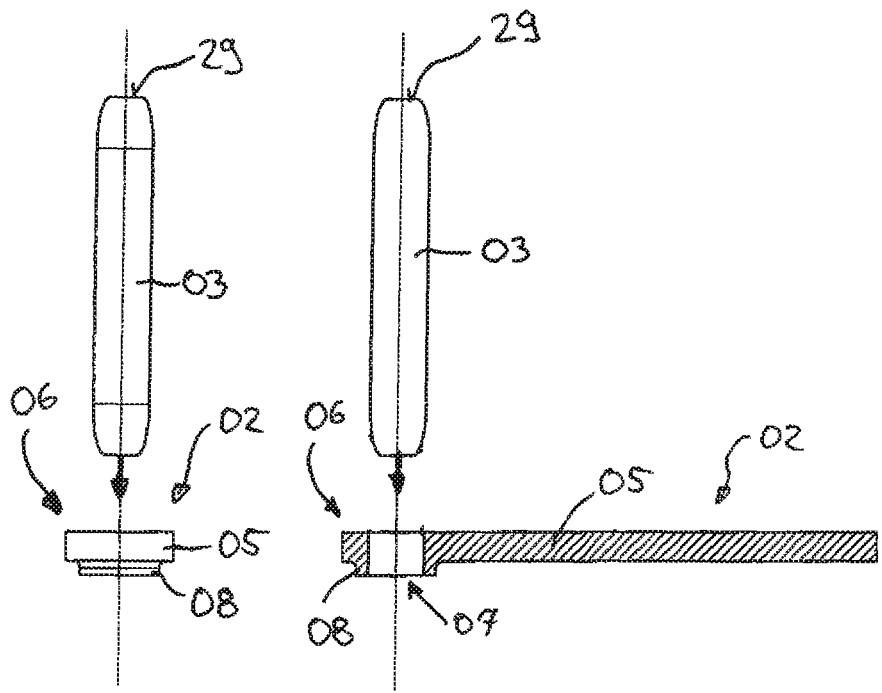
FIG. 4 shows the conductor strip according to FIG. 3 when disposing a contact pin, before pressing the contact pin in, in a cross-sectional and lateral view.

FIG. 4 shows the conductor strip 02 and the contact pin 03 directly before the contact pin is pressed into the recess 07. The contact pin 03 is produced by wire sections being cut to length, said cutting to length being carried out by tearing off the contact pins. A tear surface is therefore formed at each of the frontal sides 29, said tear surface in each instance bordering on a material constriction 09 which is formed by the continuous wire being torn. Hence, the outer diameter of the contact pin 03 is slightly larger, for example a few tenths of a millimeter larger, than the inner diameter of the recess 07. Before being pressed in the contact pin 03 can be inserted into and centered in the recess 07 via the constriction 09 without any problems.

Figure 5:
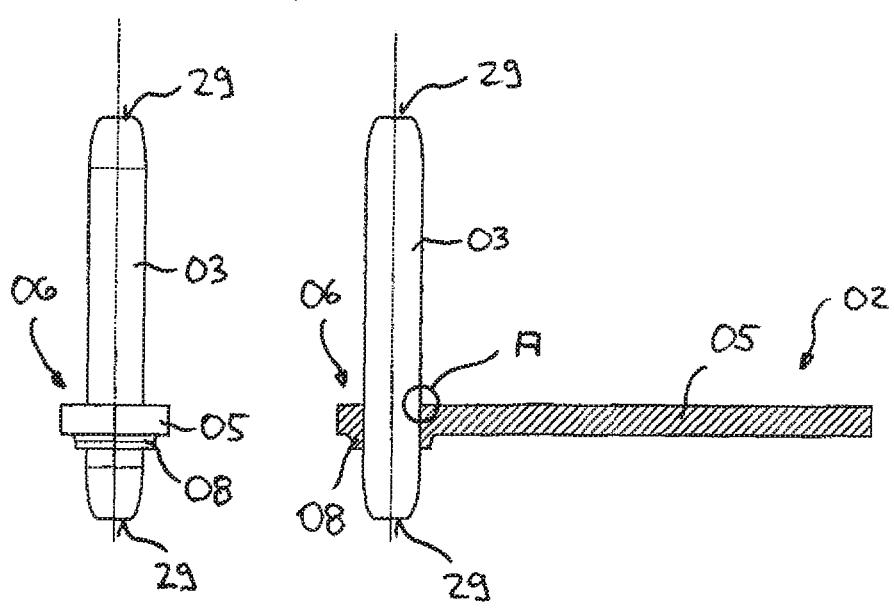
FIG. 5 shows the conductor strip having the contact pin according to FIG. 4, after the contact pin has been pressed in, in a cross-sectional and lateral view.

FIG. 5 shows the conductor strip 02 and the contact pin 03 after the contact pin 03 has been pressed into the recess 07; it can be seen that the contact pin 03 protrudes over the end cross sections of the recess 07 with both ends. In other words, this means that the contact pin 03 is passed through the conductor strip 02 when being pressed in in order to compensate for dimensional tolerances in the area of the material overlap between the inner diameter of the recess 07 and the outer diameter of the contact pin 03. Since the contact pin 03 is formed mirror-symmetrical regarding its middle and the two ends have the same shape, the contact pin 03 can be supplied and pressed in with either of its two ends first.

Figure 6:
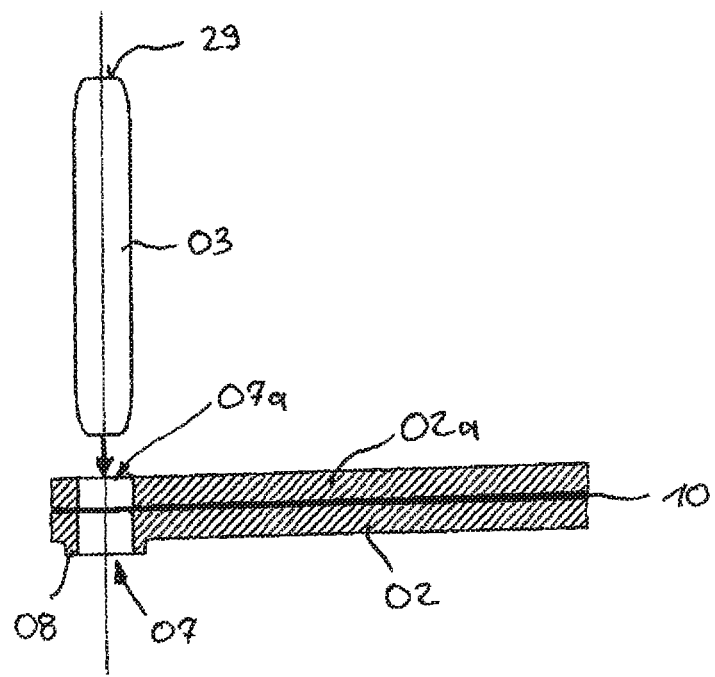
FIG. 6 shows two conductor strips when disposing a shared contact pin, before pressing the contact pin in, in a cross-sectional view.
Figure 7:
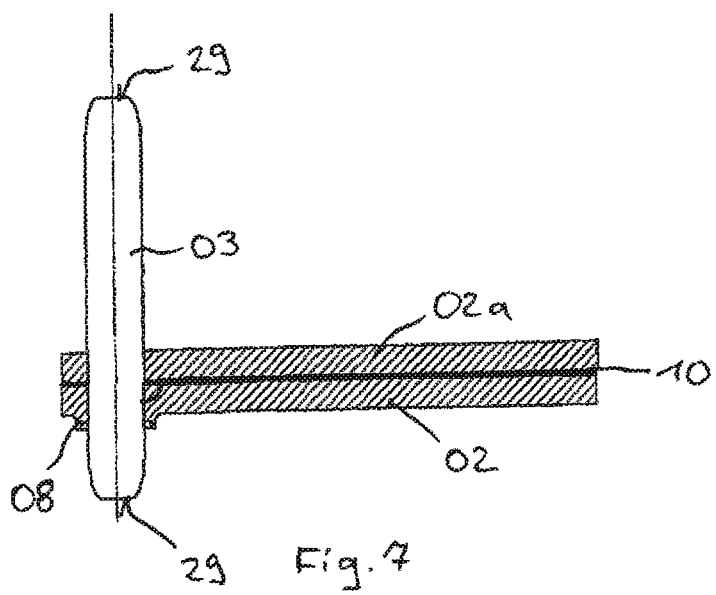
FIG. 7 shows the conductor strips having the contact pin according to FIG. 6, after the contact pin has been pressed in, in a cross-sectional view.

FIG. 6 and FIG. 7 schematically show a method for plating through two conductor strips 02 and 02a by pressing a contact pin 03 in. For this purpose, the two conductor strips 02 and 02a are arranged on top of each other in such a manner that the two recesses 07 and 07a are aligned flush atop of each other. The conductor strips are contacted with each other by pressing the contact pin 03 in, the two ends 09 each protruding over the conductor strips 02 and 02a. For this purpose, an insulating layer 10 can be provided between the conductor strips 02 and 02a.

Figure 8:
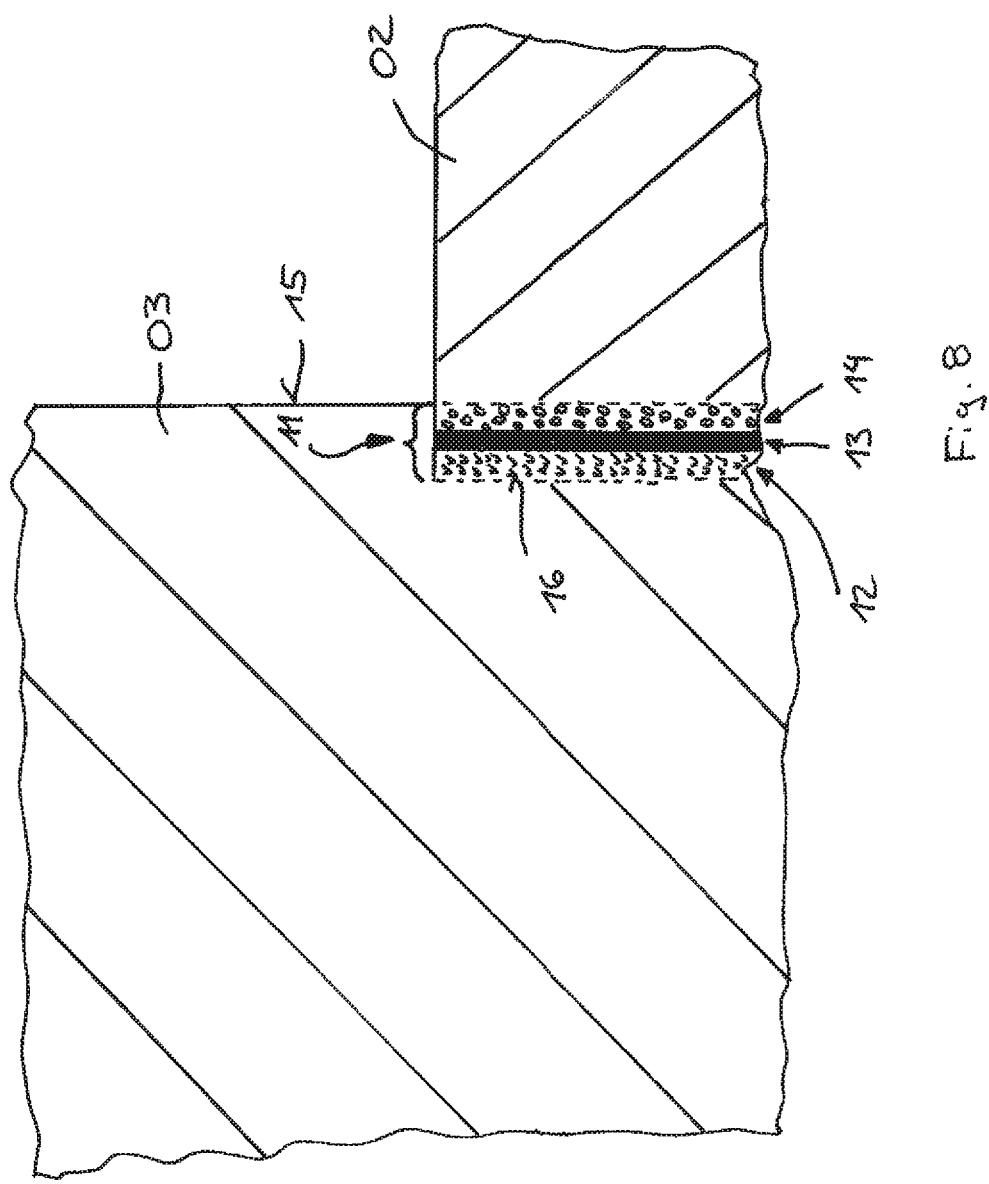
FIG. 8 shows the contact zone between the conductor strip and the contact pin according to FIG. 5 in an enlarged section A.

FIG. 8 shows the contact pin 03 and the conductor strip 02 in an enlarged section A according to FIG. 5. An annularly shaped cold-pressure-welded transition zone 11 is formed between the contact pin 03 and the conductor strip 02, said transition zone 11 being shown in FIG. 8 in only a schematic manner and in an exemplarily enlarged scale in order to better understand the invention. In the transition zone 11, an annularly shaped cold-working zone 12, which consists of the material of the contact pin 03, an annularly shaped welding zone 13, in which the material of the contact pin 03 and the material of the conductor strip 02 are integrally welded together, and an annularly shaped cold-working zone 14 made of the material of the conductor strip 02 are arranged behind each other. The cold-working zones 12 and 14 and the welding zone 13 are formed when the contact pin 03 is pressed into the recess 07 of the conductor strip 02 due to the material overlap between the outer perimeter 15 of the contact pin 03 and the inner perimeter 16 of the recess 07. The material overlap is to be chosen depending on the material selected for the contact pin 03 and the conductor strip 02 such that a welding zone 13 is formed at least in sections after the contact pin 03 has been pressed into the recess 07, said contact pin 03 being integrally cold-welded to the conductor strip 02 in the welding zone 13. This can be easily controlled by producing microsections. The geometry of the cold-working zones 12 and 14 shown in FIG. 8 is to be understood only in a schematic manner since the actual ratios heavily depend on the materials used in each case.

By calibrating the outer perimeter 15 at the contact pin 03 or by either alternatively or additionally calibrating the inner perimeter 16 in the recess 07 of the conductor strip 02, a safe process control can be attained when forming the welding zone 13, which ensures a high contact quality between the contact pin 03 and the conductor strip 02. By applying coatings in the area of the outer perimeter 15 or the inner perimeter 16, respectively, the quality of the electrical contact in the welding zone 13 can moreover be enhanced.

Figure 9:
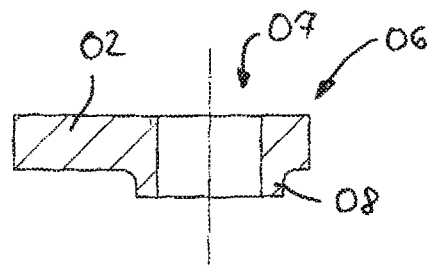
FIG. 9 shows a conductor strip comprising a cylinder-shaped recess and a protrusion in a cross-sectional view.

FIG. 9 shows the end 06 of the conductor strip 02 having the cylinder-shaped recess 07 and the protrusion 08 in an enlarged cross section.

Figure 10:
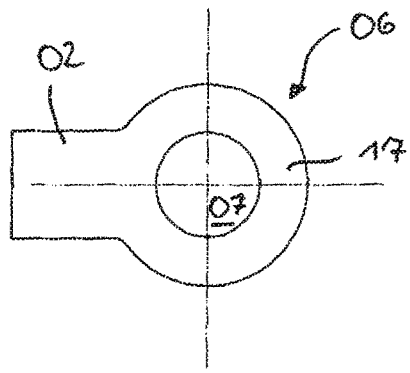
FIG. 10 shows the conductor strip according to FIG. 9 in a top view.

FIG. 10 shows the end 06 of the conductor strip 02 in a top view. It can be seen that the material of the conductor strip 02 surrounds the recess 07 in an annulus-segment-shaped contact area 17. When pressing the contact pin 03 into the recess 07, this annulus-segment-shaped contact area is not only plastically deformed at the inner perimeter 16 but is also elastically widened in the radial direction. This elastic widening causes an elastic restoring force, through which the inner perimeter 16 is pressed against the outer perimeter 15 and is pre-stressed after the contact pin 03 has been pressed in. By means of this elastic pre-stressing of the annulus-segment-shaped contact area 17, creeping and ageing processes can be compensated in regard of the electrical conductive quality since the material of the conductor strip 02 is continuously pressed against the material of the contact pin 03 via the elastic pre-stressing.

Figure 11:
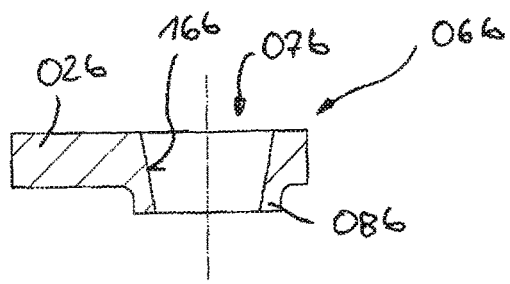
FIG. 11 shows a second conductor strip having a cone-segment-shaped recess in a cross-sectional view.

FIG. 11 shows another embodiment 02b of a conductor strip. At the end 06 of the conductor strip 02b, a recess 07b shaped like a cone segment in its cross section is provided, which in turn also engages through a protrusion 08b. By means of the cone-shaped constriction of the cross section of the recess 07b, it is possible for dimensional tolerances in the area of material overlap between the outer perimeter 15 of the contact pin 03 and the inner perimeter 16b of the conductor strip 02b to be compensated for without difficulty. The opening angle of the cone-shaped recess 07b is shown in an exaggerated manner in FIG. 11. In most instances, an opening angle of only a few degrees suffices for ensuring the required tolerance compensation.

Figure 12:
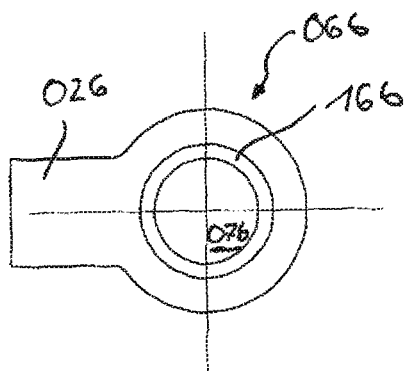
FIG. 12 shows the conductor strip according to FIG. 11 in a top view.

FIG. 12 shows the conductor strip 02b in a top view, the cross-sectional constriction of the recess 07b having different diameters being visible at the two end cross sections.

Figure 13:
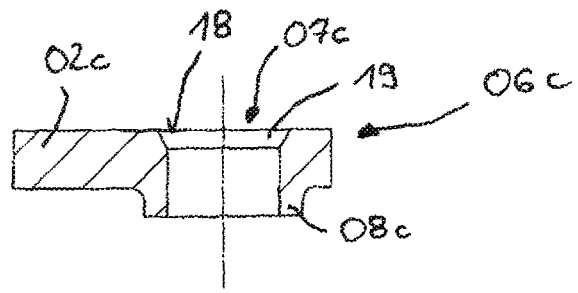
FIG. 13 shows a conductor strip having a cylinder-shaped recess and a chamfer at an end cross section in a cross-sectional view.

FIG. 13 shows another embodiment 02c of a conductor strip, at whose ends 06c, in turn, a recess 07c is formed. The recess 07c also engages through the protrusion 08c. A cone-shaped chamfer 19 is formed at the upper end cross section 18 of the recess 07c in order to simplify inserting and centering of the contact pin 03 before it is pressed in.

Figure 14:
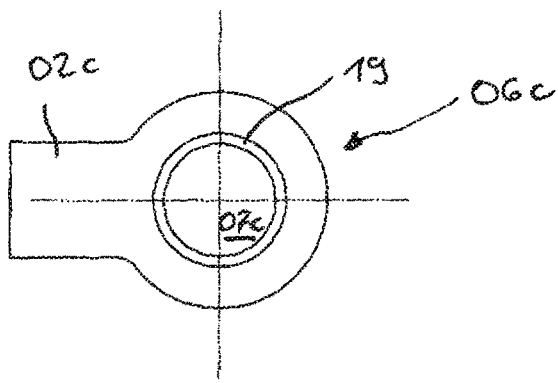
FIG. 14 shows the conductor strip according to FIG. 13 in a top view.

FIG. 14 shows the conductor strips 02c having the chamfer 19 in a top view.

Figure 15:
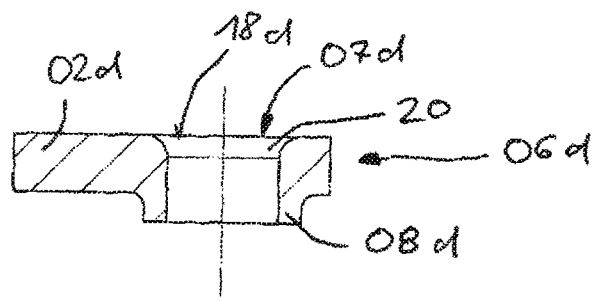
FIG. 15 shows another embodiment of a conductor strip having a cylinder-shaped recess and a radius at an end cross section in a cross-sectional view.

FIG. 15 shows another embodiment 02d of a conductor strip, at whose cylinder-shaped recesses 07d a radius 20 is formed in the area of the end cross section 18d, said radius 20 in turn simplifying inserting and centering the contact pin 03 before it is pressed in.

Figure 16:
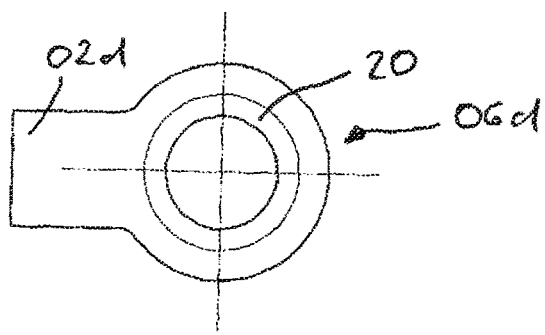
FIG. 16 shows the conductor strip according to FIG. 15 in a cross-sectional view.

FIG. 16 shows the conductor strips 02d having the radius 20 in a top view.

Figure 17:
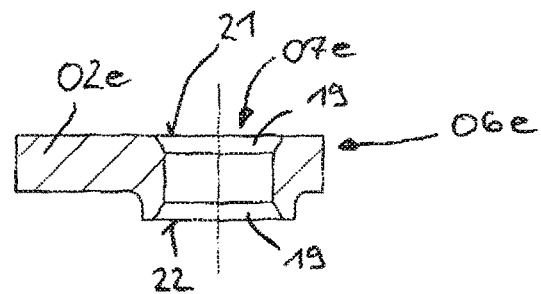
FIG. 17 shows another embodiment of a conductor strip having a cylinder-shaped recess and two chamfers at both end cross sections in a cross-sectional view.

FIG. 17 shows another embodiment 02e of a conductor strip having a cylinder-shaped recess 07e, which comprises chamfers 19 at each of the end cross sections 21 and 22. In this manner, the contact pin 03 can be pressed into the recess 07e from either the top or the bottom as desired.

Figure 18:
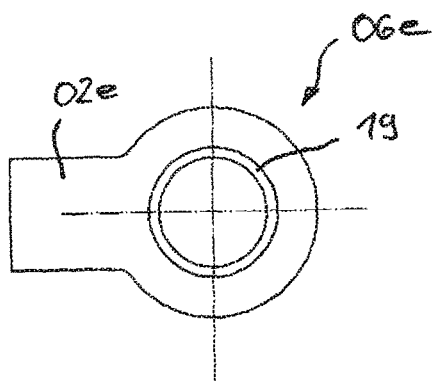
FIG. 18 shows the conductor strip according to FIG. 17 in a top view.

FIG. 18 shows the conductor strip 02e in a top view.

Figure 19:
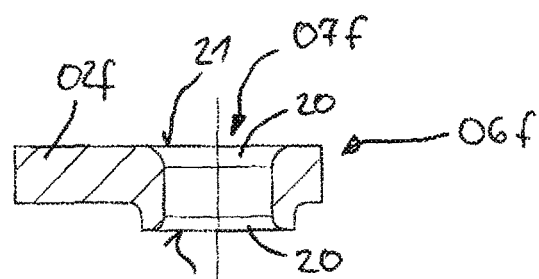
FIG. 19 shows another embodiment of a conductor strip having a cylinder-shaped recess and two radii at both end cross sections in a cross-sectional view.
Figure 20:
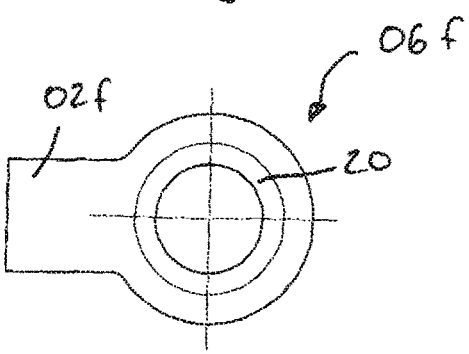
FIG. 20 shows the conductor strip according to FIG. 19 in a top view.

FIG. 19 and FIG. 20 show another embodiment 02f of a conductor strip, whose cylinder-shaped recess 07f comprises radii 20 at each of its end cross sections 21 and 22 so that the contact pin 03 can be pressed into the conductor strip from either the top or the bottom as desired.

Figure 21:
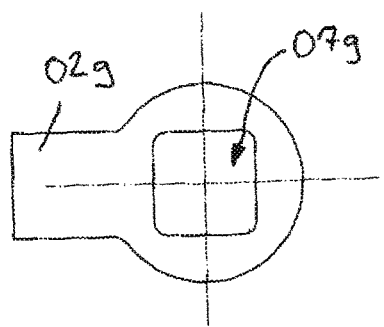
FIG. 21 shows a conductor strip having a prismatic, namely square, recess in a top view.

FIG. 21 shows another embodiment 02g of a conductor strip having a prismatic recess 07g. The prismatic recess 07g comprises an essentially square cross section, whose corners are rounded off. The contact pin, which is to be used here and which is pressed into the conductor strip 02g, comprises a cross section complementary in form, wherein in turn a suitable material overlap is to be provided in order to form the cold-pressure-welded transition zone according to the invention when the contact pin is pressed in.

Figure 22:
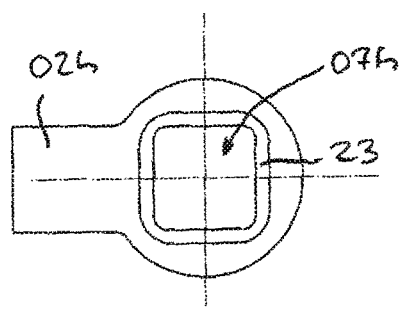
FIG. 22 shows a conductor strip having a prismatic, namely rectangular, recess and a chamfer at the end cross sections in a top view.
Figure 23:
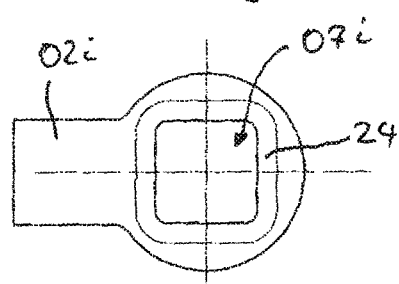
FIG. 23 shows a conductor strip having a prismatic, namely rectangular, recess having a radius at the end cross sections in a top view.

FIG. 22 and FIG. 23 show embodiments 02h and 02i, which in turn comprise prismatic recesses 07h and 07i. Either a square-shaped chamfer 23 or a square-shaped radius 24 is formed at the end cross sections of the recesses 07h and 07i.

Figure 24:
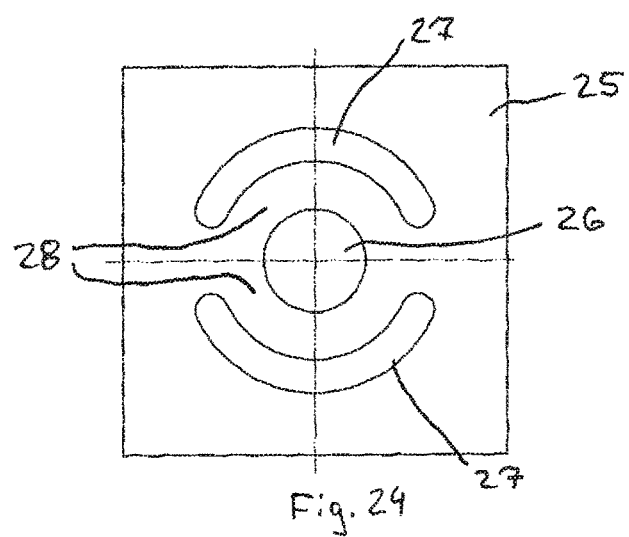
FIG. 24 shows a square conductor strip having a cylinder-shaped recess and annulus-segment-shaped relief openings in a top view.

FIG. 24 shows a conductor strip 25, wherein the rectangular outer perimeter of the conductor strip 25 is to be understood merely as an example. A recess 26 is provided in the conductor strip 25, a contact pin 03 being able to be inserted into said recess 26. In order to ensure a tight and continuous fit of the contact pin 03 in the recess 26, two relief slits 27 are additionally formed in the conductor strip 25, said relief slits 27 surrounding the contact area 28 in sections. An elastic widening of the annular contact area 28 in the area of the relief slits 27 is enabled via the relief slits 27 so that the contact area 28 is elastically pre-stressed after pressing the contact pin 03 in and elastically presses the inner perimeter of the recess 26 against the outer perimeter of the contact pin 03.

The invention claimed is:

1. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein the contact pin engages through at least two conductor strips being arranged above one another with two recesses aligned flush atop of each other and electrically contacts the two conductor strips.

2. The electrical functional component according to claim 1, wherein the contact pin engages entirely through the conductor strip in a recess and at least partially protrudes over the conductor strip with both ends.

3. The electrical functional component according to claim 1, wherein a cross section of the contact pin is formed mirror-symmetrical about a center of the contact pin.

4. The electrical functional component according to claim 1, wherein the cross section of the recess receiving the contact pin is formed mirror-symmetrical regarding its middle.

5. The electrical functional component according to claim 1, wherein the contact zone is arranged on one end of the conductor strip, the annular cold-pressure-welded transition zone being surrounded by an annular-segment-shaped contact area formed by an end of the conductor strip.

6. The electrical functional component according to claim 1, wherein the annular cold-pressure-welded transition zone has a cylinder-shaped or prismatic design.

7. The electrical functional component according to claim 1, wherein a functional component is realized in the type of a printed circuit board or a plug or an illuminant.

8. The electrical functional component according to claim 1, wherein the conductor strip and/or the contact pin comprise(s) a metallic coating.

9. The electrical functional component according to claim 8, wherein the resistance to deformation of a coating material is lesser than the resistance to deformation of a coated material.

10. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein the contact pin comprises a cross-sectional reduction on at least one end, the cross-sectional reduction comprising at least one of a chamfer on at least one end of a cross section, a radius on at least one end of the cross section, or a cone-segment-shaped cross section.

11. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein the contact pin comprises a tear surface on at least one frontal side, a cross section of the contact pin being constricted at the frontal side.

12. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein the recess receiving the contact pin comprises a cross-sectional widening on at least one side, the cross-sectional widening comprising at least one of a chamfer on at least one end of a cross section, a radius on at least one end of the cross section or a cone-segment-shaped cross section.

13. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein the contact pin comprises an outer perimeter calibrated at least in sections and/or that a recess or the indentation comprises an inner perimeter calibrated at least in sections.

14. A method for producing an electrical functional component, comprising the following method steps:
   a) producing at least one recess or indentation in an electrically conductive conductor strip by using a mandrel to punch the at least one recess in a conductive sheet, the punching process forming an annular protrusion extending from the conductive sheet adjacent the at least one recess;
   b) tearing a continuous wire material into wire sections to form a contact pin having tear sections formed at the frontal sides of the contact pin, the contact pin having an outer perimeter larger than the inner perimeter of the recess or the indentation at least in sections, an end of the contact pin being disposed at or inserted into the recess or the indentation;
   c) pressing the contact pin into the recess or the indentation, an annular cold-pressure-welded transition zone being formed by the cross-sectional overlap between the contact pin on the one hand and the recess or the indentation in the conductor strip on the other hand while the contact pin is pressed in, said contact pin and said conductor strip being electrically connected to each other in a welding zone of the transition zone by material bonding.

15. The method according to claim 14, wherein the recess punched into the conductive sheet is calibrated to a nominal diameter, in particular using the mandrel or a calibration tool.

16. An electrical functional component having at least one electrically conductive conductor strip formed from a conductive sheet with a punched grid, at least one contact pin being mounted on the conductor strip, said contact pin comprising a plug adapted to be contacted with a contact element comprising a socket, and a contact zone being provided between the conductor strip and the contact pin, said contact zone electrically connecting the conductor strip and the contact pin to each other, wherein the electrically conductive contact zone is formed as an annular cold-pressure-welded transition zone, a surface material of the conductor strip and/or a surface material of the contact pin comprises at least one cold-working zone in the transition zone, a welding zone is provided at least in a section on or in the at least one cold-working zone, and the contact pin and the conductor strip are connected to each other in the welding zone by material bonding in an electrically conductive manner, wherein the conductor strip comprises an annular protrusion extending from the conductive sheet in the area of the contact zone, said protrusion forming a material thickening in the conductor strip, wherein a second conductor strip is aligned flush atop and arranged above the conductor strip and the contact pin is pressed in so as to at least partially engage the recess in the conductor strip and a second recess in the second conductor strip.

* * * * *